(12) United States Patent
Ratcliffe (10) Patent No.: US 10,979,003 B2
(45) Date of Patent: Apr. 13, 2021

(54) INCREASED AUDIO POWER OUTPUT AMPLIFIER CONFIGURATION INCLUDING FAULT TOLERANCE SUITABLE FOR USE IN ALARM SYSTEMS

(71) Applicant: Honeywell International Inc., Morris Plains, NJ (US)

(72) Inventor: Ashley Phillip Ratcliffe, Hinckley (GB)

(73) Assignee: Honeywell International Inc., Charlotte, NC (US)

( * ) Notice: Subject to any disclaimer, the term of this patent is extended or adjusted under 35 U.S.C. 154(b) by 164 days.

(21) Appl. No.: 16/229,208

(22) Filed: Dec. 21, 2018

(65) Prior Publication Data

US 2019/0273472 A1    Sep. 5, 2019

(30) Foreign Application Priority Data

Dec. 29, 2017  (EP) .................................... 17211207

(51) Int. Cl.
*H03F 3/72*    (2006.01)
*H03F 1/52*    (2006.01)
(Continued)

(52) U.S. Cl.
CPC .............. *H03F 1/523* (2013.01); *H03F 1/52* (2013.01); *H03F 3/183* (2013.01); *H03F 3/2171* (2013.01);
(Continued)

(58) Field of Classification Search
CPC ... H03F 3/38; H03F 3/68; H03F 1/523; H03F 3/183; H03F 1/52; H03F 2200/03;
(Continued)

(56) References Cited

U.S. PATENT DOCUMENTS 4,439,740 A   3/1984  Harrington
6,294,955 B1  9/2001  Luu et al.
(Continued)

FOREIGN PATENT DOCUMENTS

EP    2911222      8/2015
WO    2015112047   7/2015

OTHER PUBLICATIONS

Extended European Search Report from priority EP Application No. 17211207.0 dated Jul. 6, 2018 (9 pages).
(Continued)

*Primary Examiner* — Paul Kim
*Assistant Examiner* — Ubachukwu A Odunukwe
(74) *Attorney, Agent, or Firm* — Brooks, Cameron & Huebsch, PLLC (57) ABSTRACT

Audio amplification used in security systems need to be robust and have failsafe capability, they also need to be compact and energy efficient. A means of providing this by combining class D amplifiers in series is provided along with means to disconnect the amplifiers in a failure mode so as to provide ongoing operation should 1 of the amplifiers malfunction or another part of the system associated one of the amplifiers malfunction. The invention comprises an audio output stage which may be further integrated into an audio system having a supervisory controller to manage the transition from normal operation to failure state operation.

18 Claims, 9 Drawing Sheets

(51) Int. Cl.
  *H03F 1/02* (2006.01)
  *H03F 3/217* (2006.01)
  *H04R 3/00* (2006.01)
  *H03F 3/183* (2006.01)
  *G08B 3/10* (2006.01)

(52) U.S. Cl.
  CPC ............. *H03F 3/2178* (2013.01); *H04R 3/00* (2013.01); *G08B 3/10* (2013.01); *H03F 2200/03* (2013.01); *H03F 2200/426* (2013.01); *H03F 2200/447* (2013.01); *H03F 2203/21106* (2013.01)

(58) Field of Classification Search
  CPC ......... H03F 2200/426; H03F 2200/447; H03F 3/72; H03F 3/45475; G08B 3/10
  USPC ...... 381/120; 330/124 D, 124 R, 295, 10, 51
  See application file for complete search history.

(56) References Cited

U.S. PATENT DOCUMENTS

| | | | |
|---|---|---|---|
| 2005/0174170 A1* | 8/2005 | Herold | H03F 3/72 330/51 |
| 2006/0159292 A1* | 7/2006 | Guilbert | H03F 3/45475 381/120 |
| 2014/0301570 A1* | 10/2014 | Morriss | H03F 3/183 381/107 |

OTHER PUBLICATIONS

Examination Report from priority EP Application No. 17211207.0 dated Jul. 31, 2019 (3 pages).
Communication under Rule 71(3) EPC from priority EP Application No. 17211207.0 dated Sep. 30, 2020 (58 pgs).

* cited by examiner

INCREASED AUDIO POWER OUTPUT AMPLIFIER CONFIGURATION INCLUDING FAULT TOLERANCE SUITABLE FOR USE IN ALARM SYSTEMS

CROSS REFERENCE TO RELATED APPLICATION

This application claims priority to EP Application No. 17211207.0 filed Dec. 29, 2017, which is incorporated by reference in its entirety.

The application relates to amplifiers and methods of connecting two or more amplifiers to sum the audio output power using an efficient modular approach, associated with monitoring or alarm systems installed in regions of interest. This application pertains to a fault tolerant amplifier arrangement for using such amplifiers in adverse operating conditions so as to maintain operation in various failure modes.

BACKGROUND

Voice alarm amplifiers can be found in regional monitoring, security systems and fire alarm systems. They provide electrical signals to sets of audio transponders to thereby provide audible, or verbal, outputs to individuals in the region being monitored in response to detected alarm conditions.

System flexibility in terms of the audio power per transponder line is important and a user controlled method is desired to connect two or more amplifiers together to increase the audio power per transponder line as required by the end user. Also given the stressful or chaotic conditions that can be present in a fire or other type of alarm condition, intelligibility and integrity of life-safety messages is very important. It is also important to identify internal amplifier faults and external wiring faults by continuous monitoring and self-test. Additionally, it can be important to be able to respond to faults that occur during an emergency, such as amplifier channel faults, for example due to partial earth faults, over-loading faults and other issues such as may arise due to fire damage to cabling or transponders. At times, the amplifiers themselves may fail and so inadequate, or the absence of electrical signals may produce conditions that impair the intelligibility and integrity of life-safety messages. By example, U.S. Pat. No. 9,401,687 discloses amplifiers and methods of operating amplifiers associated with monitoring or alarm systems.

Whilst redundancy in equipment may address some of these concerns the basic concept, doubling of channels is wasteful and requires means to integrate with other system components if only partial redundancy is required. Such options are not necessarily immediately evident and require complex design choices. Using audio amplifiers in parallel is known in the art such as disclosed in the Wikipedia entry for bridged and paralleled amplifiers. As a specific example, WO 2005/101678 discloses the hybrid combination of linear and switched mode power amplifiers in series.

Many classes of amplifiers are available, specific implementation constraints make amplifiers far from interchangeable, particularly in any system needing to comply with current engineering practises and standards. One class of amplifier known for use in alarm systems is the Class-D audio power amplifier. Such an amplifier is disclosed in U.S. Pat. No. 3,939,380. These are energy efficient and compact and as such are suitable for compact installations. The push pull nature of any amplifier's output makes direct connection in redundant pairs problematic as any fault on one amplifier's output will directly affect the other amplifier therefore defeating the object. There is therefore a significant technical opportunity if class-D amplifiers can be connected together in order to increase audio output power as required, using a modular amplifier approach, which is immune to a single point of failure, that will affect all the amplifier modules. Also, a method is required to enable robust use in a fault inducing environment—such as in a fire or in an enclosed secure area. US2014176135 discloses a class D amplifier with parallel outputs as a means to provide redundancy.

In more detail, a class-D amplifier, also termed a switching amplifier, is an electronic amplifier in which the amplifying components (typically MOSFETs) act as electronic switches, rather than as linear gain devices as with other amplifiers. The MOSFETs rapidly switching back and forth between the supply rails, when fed by a pulse and so are modulated by pulse width or density, to encode an audio input into a pulse train. The amplified audio then passes through a simple low-pass filter into a loudspeaker or similar audio transducer. Thereby high-frequency pulses, which are typically no greater than 500 KHz, are blocked. Since the pairs of MOSFETs output transistors are never conducting at the same time, there is no other path for current flow apart from the low-pass filter/loudspeaker. For this reason, efficiency can exceed 90%.

However, Class-D amplifiers operate by generating a train of square wave pulses of fixed amplitude but varying width and separation, or varying number per unit time, representing the amplitude variations of the analog audio input signal. These pulses are used to gate the output MOSFETs on and off alternately. Hence, care is taken to ensure that the pair of transistors are never allowed to conduct together as this mistimed switching would cause a short circuit between the supply rails through the transistors. Since the transistors are either fully "on" or fully "off", they spend very little time in the linear region, and dissipate very little power and this provides their high efficiency. A simple low-pass filter consisting of an inductor and a capacitor can be used to provide a path for the low-frequencies of the audio signal, leaving the high-frequency pulses behind. Even after such a filter a pair of amplifier outputs if connected in parallel will provide a voltage mismatch and as such, will effectively short between each other to remove that voltage difference. This is further complicated as the train of square wave pulses on one amplifier need to be at the same frequency and synchronised to the train of square wave pulses on the connecting amplifier in order to reduce the likelihood of sink source current contention between the two or more connected amplifier outputs. One approach is to have one amplifier module to be a clock source master, which is used by the other slave amplifiers for its train of square wave pulses. Alternatively, a dedicated clock source can be used to generate and synchronise the train of square wave pulses required for each amplifier. In both cases however there is a single point of failure when two or more amplifiers are connected in parallel due to the common need for a master clock source. Even if the class D stage carriers for all amplifiers are synchronised, there is still a need to have some current limiting resistors connected between the amplifier outputs to further reduce sink source current contention between amplifiers, which can result in damage to the respective output stages. Furthermore, these resistors are counter-productive, as they reduce the inherent efficiency and system compactness requiring both space and heat dissipation.

There is therefore a need to provide an amplifier system suitable for use in an alarm system which provides one or more of compactness, amplifier outputs connected in series, has independent modular redundancy, is energy-efficiency, robustness and provides failsafe features. There is preferably need to provide an amplifier system combining all these features.

DETAILED DESCRIPTION

The present invention provides:

An output stage for an audio system comprising two class-D amplifiers, the stage providing amplification using one or more of the class-D amplifiers, the amplification being of an incoming audio signal to produce an output of an audio power signal for driving one or more sets of audio transducers to provide an audible output, the output stage further comprising:

in a first mode the two class-D audio amplifiers in series and in a failure mode one of the class-D amplifiers and an isolated class-D amplifier;

wherein the transition from the first to the second mode comprises:

detecting a fault;

isolating one class-D amplifier and channelling input and output signals to and from another class-D amplifier.

The present invention uses the class-D amplifiers in series, rather than in parallel as would normally be the case when providing redundancy/parallelism. In particular, placing two switch mode power supplies or class D amplifiers in parallel to double the output power is possible, but requires that: Voltage gain has to be identical for each amplifier to mitigate potential output current contention between amplifiers; Class D digital carriers for each amplifier need to be synchronized to minimize the risk of output current contention. Having to synchronize the digital carriers also becomes a single point of failure for both the amplifiers when connected in parallel and the benefit of redundancy is therefore diminished. Similarly, another requirement is for a parallel mode adaptor comprising of low resistance power resistors to reduce output amplifier current contention. This approach also dissipates a percentage of the available output power as heat, is an additional cost and provides a further single point of failure.

Figure 6:
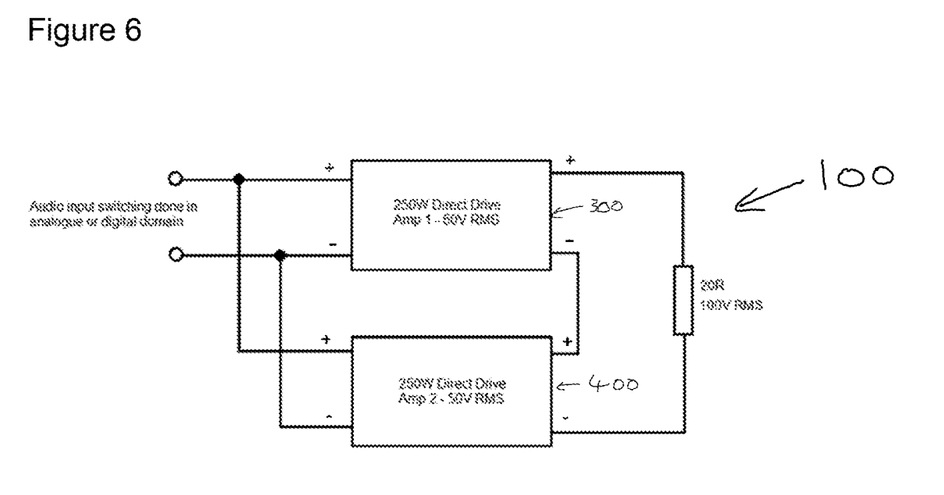
FIG. 6 shows schematically the series amplifier configuration of the present invention in normal operation, the 1st mode.

The first mode of the present invention is shown schematically in FIG. 6. 100 is the output stage of the audio system. 300 and 400 are class D amplifiers configured in the first mode to supply a 20-ohm, audio transducer output with a 100 v RMS signal.

This provides the advantage that double the voltage output is available and as such the power output is greatly exceeded ($V^2/R$) and readily achieved for a given output impedance.

Hence, moving in the failure mode with a single amplifier means that the power is not halved and the equipment can still function effectively. This is a significant benefit over a parallel redundant configuration. However, EN54 (Voice alarm systems) mandates that the maximum audio transducer or speaker voltage permitted is 100 VRMS at the present time, therefore the only way to deliver more power is to reduce the speaker impedance, and in any installation, this is fixed. In practice therefore when amplifiers are in series the voltage gain is halved, hence with the maximum input audio signal each amplifier provides 50 VRMS. This, however, gives rise to the benefit of the increased crest factor, due to each amplifier running at half its maximum output voltage when connected in series. When a fault occurs, the faulty amplifier is impedance isolated from the system, and the voltage gain of the remaining working amplifier is doubled to provide a maximum output voltage of 100 VRMS. If the audio input signal is at the level where the remaining amplifier is overloaded, hardware and software class D carrier chopping and gain reduction techniques are used to maintain audio intelligibility to provide effective function in the failure mode.

Figure 7:
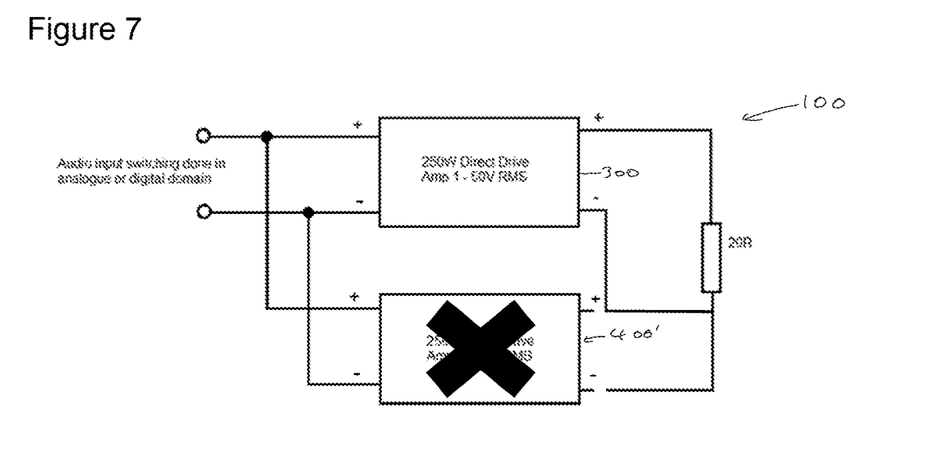
FIG. 7 shows schematically the first form of the first failure mode.

The failure of the present invention is shown schematically in FIG. 7. 100 is the output stage of the audio system. 300 is a class D amplifier configured in the failure mode to supply a 20-ohm, audio transducer output with a 100V RMS signal. 400' is an, isolated, failed class D amplifier.

The output stage for an audio system of the present invention preferably provides a first amplifier gain in the first mode and twice the gain in the second mode, this compensates for the loss of the failed amplifier in the second mode and maintains effective system function at half the previous power.

The output stage for an audio system of the present invention is preferably controlled by a microprocessor control unit (MCU). The MCU controls the transition from the $1^{st}$ mode to the failure mode.

The output stage of the two class-D audio amplifiers are preferably of the same specification, at least before the failure mode, or the cause of the failure mode arises.

Figure 8:
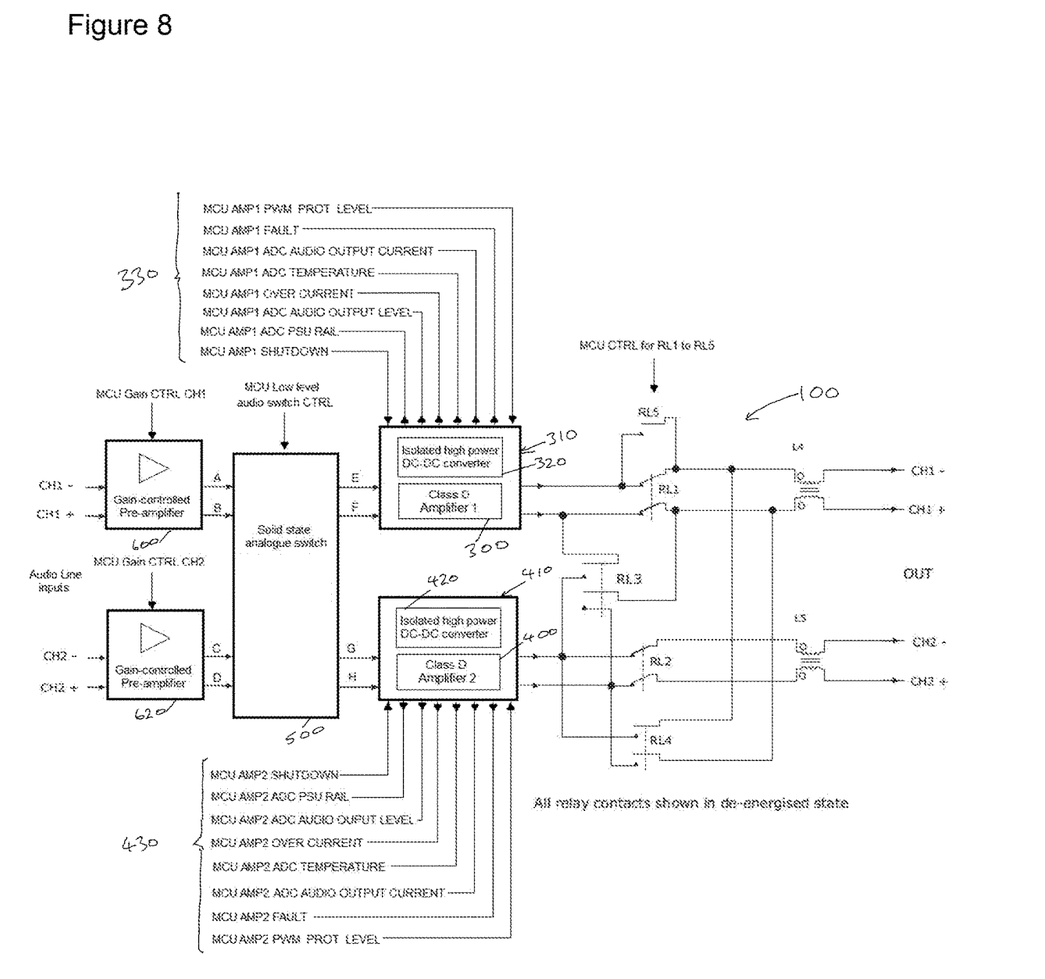
FIG. 8 shows schematically the audio system of the present invention with the relays, for illustrative purposes, as FIG. 1.

The present invention shown schematically in FIG. 8 provides an audio system, the audio system comprising:

means for receiving audio signals via an audio line input; these being fed to a plurality of gain controlled preamplifiers (600, 620); these being routed through an input analogue switch array (500); the outputs of which are routed to the aforementioned output stage, having first (300) and second (400) amplifiers; the outputs of which are rooted to an output switch array (100) and thereby to the out-side of the audio system for supplying audio transducers; the system being switchable between at least a first mode and a failure mode of the output stage by means of a microprocessor control unit configured to control the output stage.

This series Amplifier operation of the present invention yields the following advantages over connecting amplifiers in parallel:

Overall Crest factor is significantly increased when two Amplifiers are connected in series.

Crest factor is defined as the ratio of peak value to RMS value of a current or voltage waveform: The crest factor for a sinusoidal current waveform, such as that which a pure resistive load would draw, is 1.414 since the peak of a true sinusoid is 1.414 times the RMS voltage value.

Crest factor is a measure of a waveform, such as alternating current or sound, showing the ratio of peak values to the effective value. In other words, crest factor indicates how extreme the peaks are in a waveform. Crest factor 1 indicates no peaks, such as direct current.

Higher crest factors indicate peaks, for example sound waves tend to have high crest factors.

The peak-to-average power ratio (PAPR) is the peak amplitude squared (giving the peak power) divided by the RMS value squared (giving the average power). It is the square of the crest factor.

Crest factor and PAPR are therefore dimensionless quantities. While the crest factor is defined as a positive real number, in commercial products it is also commonly stated as the ratio of two whole numbers, e.g., 2:1. The PAPR is most used in signal processing applications. As it is a power ratio, it is normally expressed in decibels (dB). The crest factor of the test signal is a fairly important issue in loudspeaker testing standards; in this context it is usually expressed in dB.

20 dB Crest means average output is 20 dB less than full scale power output.

A further advantage is that there are no current sharing concerns or additional power loss by using an external parallel mode adaptor.

A yet further advantage is that an existing direct drive amplifier architecture can be re-used (such as in a retro fit) and maintains independent amplifier modularity and removes the possibility of a single point of failure for both amplifiers. This is particularly so when independent clocking of the amplifiers is used.

In the system of the present invention the MCU preferably supervises and controls the audio system. The MCU preferably controls the gain of the preamplifiers (600), 620). This provides redundancy on the input side such if one audio line input becomes inoperative, unusable, shorted or otherwise ineffective. Therefore, distorted input may be stopped from entering the audio system. Initially, if CH1 pre-amp fails CH1 is lost. This is the same for CH2. Hence, If CH2 pre-amp fails CH2 is lost. A channel has to be nominated for series operation, which for the purposes of this application is CH1 in the examples provided. This also means that CH2 is lost due to CH2 amplifier being used for series operation for CH1. Redundancy is only available when you have two amplifiers in series by isolating the faulty one, and doubling the gain on the remaining one. When amplifiers are not working in series, if Pre-amp 1 or Amp 1 fails CH1 is lost. Same for CH2, if Pre-amp 2 or Amp 2 fails CH2 is lost.

The MCU preferably controls the input analogue switch array (500). This enables the audio line inputs when passed from the preamplifiers through to the amplifiers to be appropriately rooted. Specifically, in the $1^{st}$ mode the inputs (A, B, C, D) may be combined to provide overall redundancy in the system. In the 1st mode a sub-failure mode of audio line inputs or of the pre-amplifiers may be accommodated by abandoning preamplifier input (for example A and B) with the residual inputs (C and D) feeding both amplifiers. In the failure mode the inputs (outputs of the preamplifiers A, B, C, D) our selectively rooted to the remaining amplifier (300 or 400 as the case may be). In a master failure mode accommodating the sub-failure mode and the failure mode either preamplifier (600, 620) may be connected via the analogue switch array to the remaining amplifier (300, 400). As previously stated there is no additional redundancy for failing pre-amplifiers.

In the present invention the input analogue switch array is preferably a solid-state analogue switch array as this avoids the contact bounce associated with a mechanical switch and the potential errors that this may provide in the class D type amplifier (noting the aforementioned short-circuit issues).

In the present invention the amplifier system comprising class D amplifiers (300, 400) also comprises a means for isolating one class-D amplifier and channelling output signals to and from another class-D amplifier, this is preferably in the form of an output switch array (100).

The output switch array is controlled by an MCU, when present in the system the MCU is preferably the same MCU controlling the whole system. This simplifies and removes timing issues, which is essential when using class D amplifiers, particularly in stressed and failure prone environments.

In the present invention the phrase "being routed through" means being an electrical connection, so as to perform a functionally operative interconnection between devices is recognised by person skilled in the art.

In the present invention a fault preferably means a fault in an actual amplifier, the audio system can mean in the audio system but can also mean in a plurality of sets of audio transducers fed by the amplifiers.

The fault in the amplifier may be one or more of:
a pulse width modulation protection level; an amplifier fault; an audio output over current; the temperature; a supply over current; an audio output overvoltage; and a class D amplifier power supply voltage rail error. Once any fault type is detected an equipment shutdown input signal is enabled to shut down the faulty amplifier module.

Looking at each of these faults giving rise to triggering the fault condition in more detail, each fault being detected by conventional sensors known in the art. The sensors are preferably located inside each amplifier module.

Detecting the fault may comprise detecting: a pulse width modulation protection level; and deviations from nominal class D carrier frequency.

Detecting the fault may comprise detecting: an audio output over current; this may occur due to a short in the audio transducer supply lines, such as if cut by an intruder, the system therefore acting as an alarm for such tampering.

As mentioned previously an equipment shutdown input is used to shut down the faulty amplifier/equipment. This is also used to shut down the amplifier/equipment when not in use, which is especially beneficial when under battery backup.

The fault in the amplifier is preferably one or more of:
Detecting the fault may comprise detecting: A supply over current; this can give rise to a temporary isolation into the failure mode and as such is accompanied by a recursive check for persistence of the condition to allow reset of the device. Such an overcurrent may arise due to a transient event from the pre-amplifier.

Detecting the fault may comprise detecting: An audio output overvoltage; this can give rise to a temporary isolation into the failure mode and as such is accompanied by a recursive check for persistence of the condition to allow reset of the device.

Detecting the fault may comprise detecting: A power supply unit rail error can be isolated as each amplifier preferably has an independent supply. This failure mode may be due to over or under voltage of the power supply but preferably occurs when transient voltage peaks are identified as these can disrupt the class-D amplified function and pre-emptive shut down can avoid a more catastrophic failure potentially damaging other system components.

The fault in the amplifier triggering the fault condition is more preferably:

Detecting the fault may comprises detecting: The temperature; this can give rise to a temporary isolation into the failure mode and as such is accompanied by a recursive check for persistence of the condition to allow reset of the device. Specifically, a high temperature, due to a prolonged high-power audio and simultaneous high environmental temperature conditions which can give rise to equipment failure Close-down in this condition enables re-start when in a safe condition. Also, specifically, a low temperature, such due to environmental conditions and use of low-power quiescent states for the system can give rise to equipment failure Close-down in this condition enables re-start when in a safe condition. This condition of low temperature does not hinder the fire security aspect of a security system as low temperature is not a feature of combustion. A low temperature may be below 20° C., more preferably below 4° C.

Most preferably in combination with:

Detecting the fault may comprises detecting: The humidity; this preferably accompanies the temperature criteria and permits the more accurate determination of dew point. When humidity and temperature sensing is combined shut down 1° C. or more, such as up to 5° C., above the dew point is preferred. This allows for temperature differentials in the equipment to be taken account of, where localised condensation can occur remote from the sensor.

The fault condition falling over to single amplified in the low temperature and dew point conditions provides higher energy throughput in the remaining amplified and hence amplifier heat generation to forestall its potential failure also by raising amplifier temperature. This condition is significant in the energy efficient class-D amplifiers which consequently have lower heat generation than other classes of amplifier.

Referring now in more detail to the amplifiers (300, 400) when in the audio system of the present invention, these are preferably part of an amplifier module (310, 410) which include respective power DC-DC converter circuitry, (320, 420). Each amplifier module may be set on a separate circuit board to provide improved physical and electrical isolation, which comprises of class D amplifier and isolated DC-DC power supply This is particularly useful when 1 of the amplifiers fails and produces such effects as high-temperature and high output current or a power supply fault, and therefore can be shut down and isolated from the system. Other embodiments using one isolated dc-dc converter are possible. Having one isolated DC-DC converter is not good, as this is a single point of failure for two amplifiers.

The dc outputs of these convertors (320, 420) may supply the power to the full-bridge class-d amplifier section. The dc-dc convertors, (320, 420), may be powered from a mains electricity supply by an AC-DC power supply, but preferably also have a battery backup. In such a case, each dc-dc convertor must, for example, therefore be able to provide the full output power over the input voltage range from the minimum specified battery voltage of 20.5V to the maximum PSU output voltage of 29.65V.

The dc-dc convertor is preferably a high-power push-pull type, using a center-tapped output transformer to provide the input-output isolation. Opto-coupler feedback maybe used to set the output voltage. The switching frequency is nominally 140 kHz.

Figure 9:
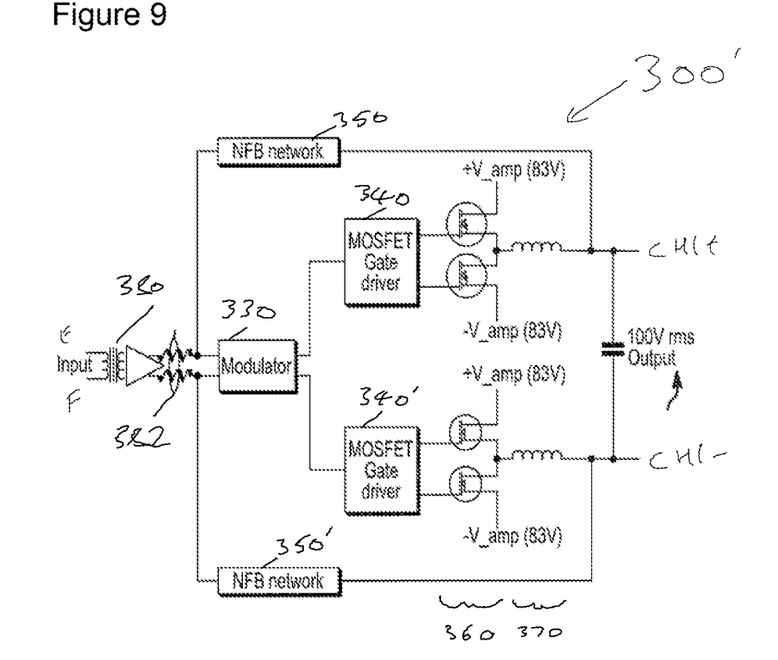
FIG. 9 shows schematically an individual amplifier for use in the present invention.

The amplifiers (300, 400) of the present invention may be configured with a fully-balanced design from input to output, and provide a floating 100 V RMS audio output (as in CH−, CH+, at the IN side, see figure Bin combination with FIG. 9. FIG. 9 is effectively (300, 400) in FIG. 8 Isolation is provided by the input coupling transformer 380 in FIG. 9, optionally together with the isolation in the dc-dc convertors (320, 420) in FIG. 8.

The amplifiers (300, 400 of the present invention are preferably of a self-oscillating PWM controlled class-D design, operating with phase-shift or hysteretic control of the oscillation. The provision of self-oscillating amplifiers has the advantage that the amplifiers are not dependent on an independent clock source and also consequent feedback through that plotline between the amplifiers should 1 of the amplifiers fail. Similarly, failure of the self-oscillating PWM controlled class-D amplifier would only affect that amplifier thus giving improved system robustness.

Preferably, the amplifiers are inverting at audio frequencies, but the combination of the phase shift of the output stage, combined with the propagation delay of the driver stage, together with any hysteresis in the modulator, modified by suitable frequency and phase compensation networks forming part of the feedback loop set a stable self-oscillation frequency of, preferably, around 280 kHz (250 to 310 kHz) at idle. The input audio signal causes this self-oscillation to be PWM modulated.

In terms of the $1^{st}$ mode and the failure mode of the present invention the inductor (see FIG. 9, right-hand side) in the output LC filter of the Amplifier module is configured to carry the full output load current when two amplifiers are connected in series, as opposed to half the total output current when connected in parallel. As a result, the inductor saturation current needs to be increased accordingly. No changes are required to the DC-DC PSU that powers the class D stage, as the output power required is the same for each amplifier.

In the present invention a relay arrangement is preferably provided to change the output stage from the $1^{st}$ mode to the failure mode.

To enable this switchover between the $1^{st}$ mode and the failure mode of the present invention an array of relays is provided. These relays can operate under the control of an MCU and in the example of the audio system do so. It will also be understood that solid state switches could be used in place of relays without departing from the spirit and scope hereof. However, conventional electromagnetic relays are preferred as these have the mechanical fail back to given states (as in FIG. 1), as opposed to solid state relay or failure states may be more random.

Figure 1:
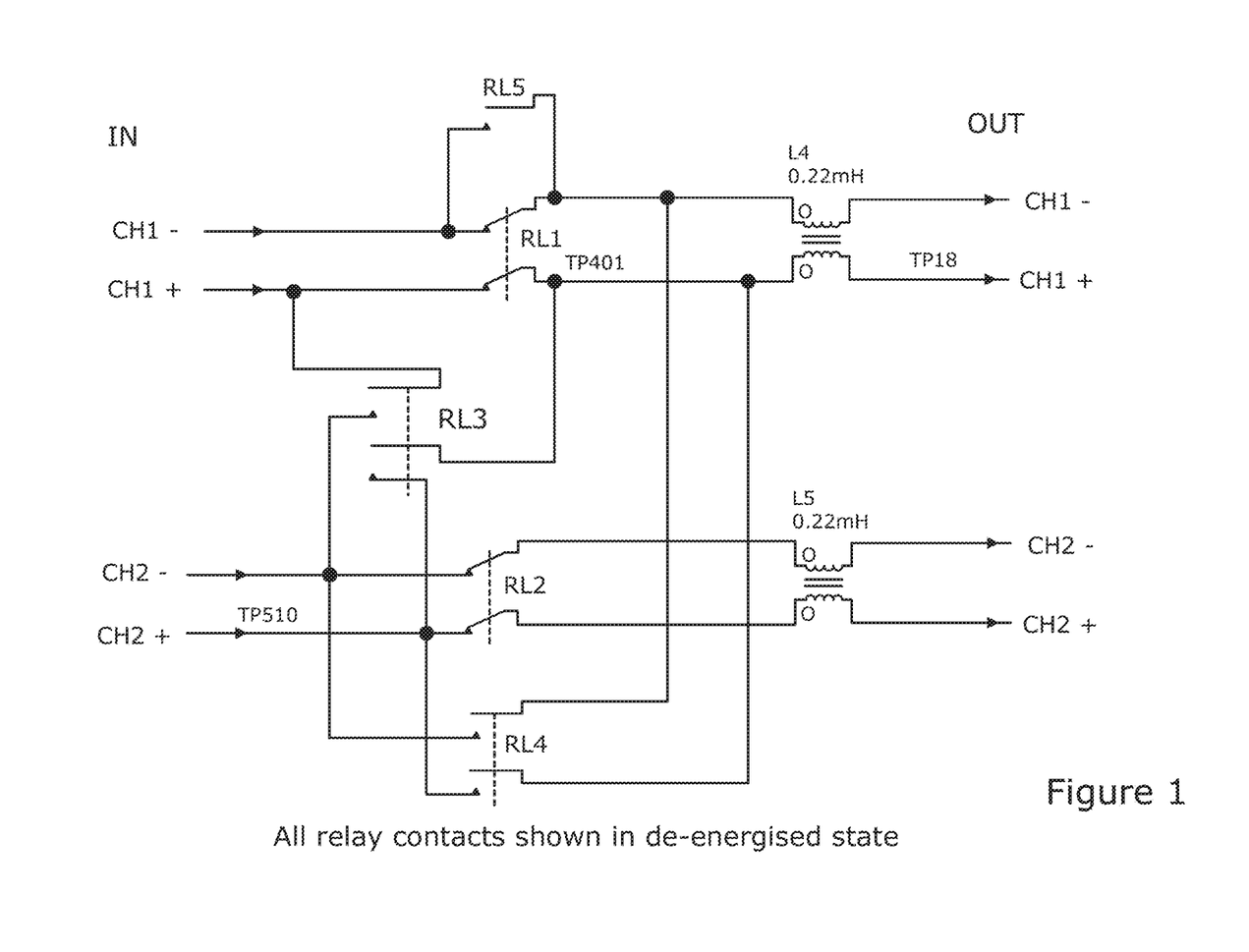
FIG. 1 shows the relay configuration of the present invention in normal operation, the 1st mode.
Figure 2:
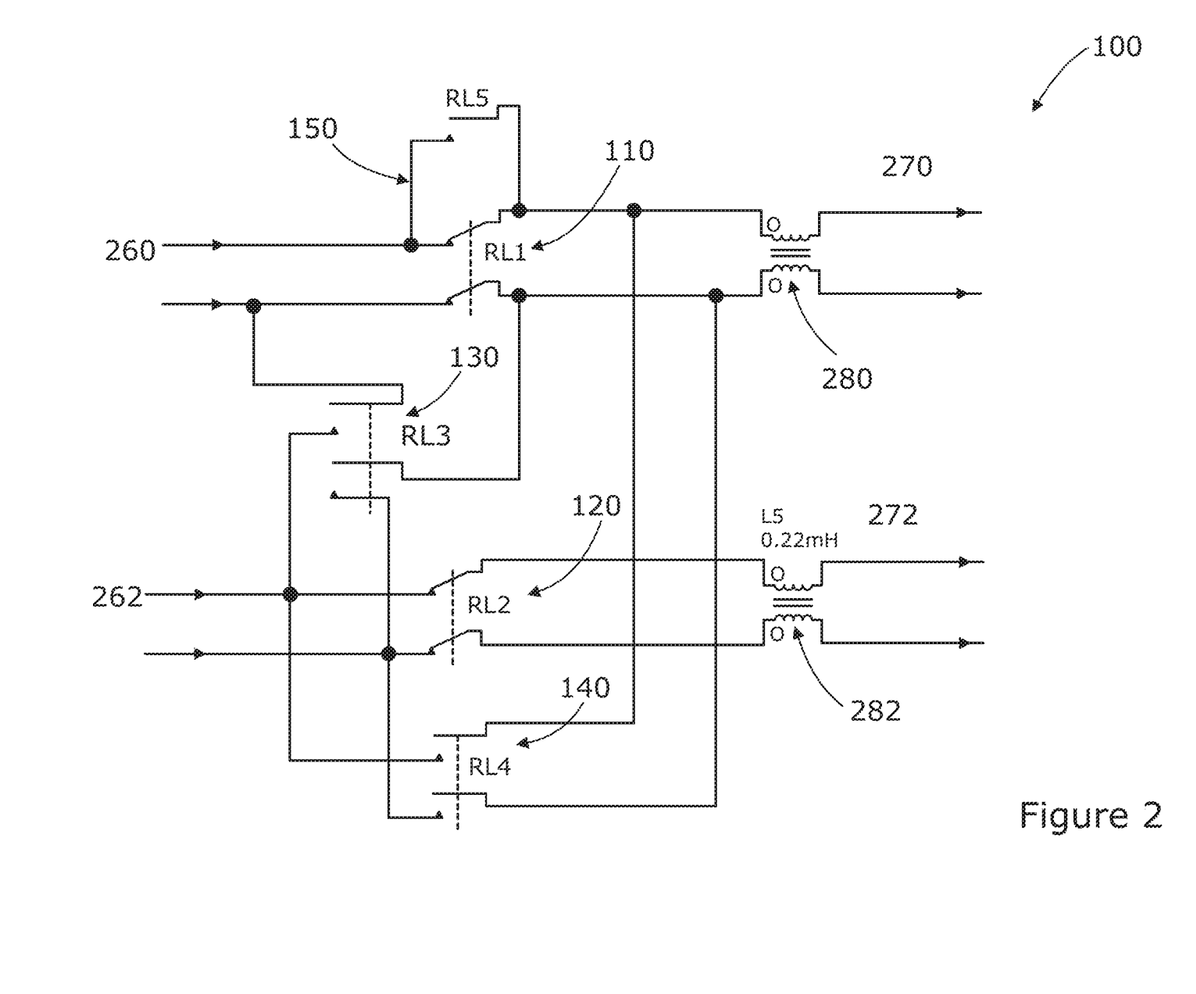
FIG. 2 shows the relay configuration of the present invention in normal operation, the 1st mode; same as FIG. 1.
Figure 3:
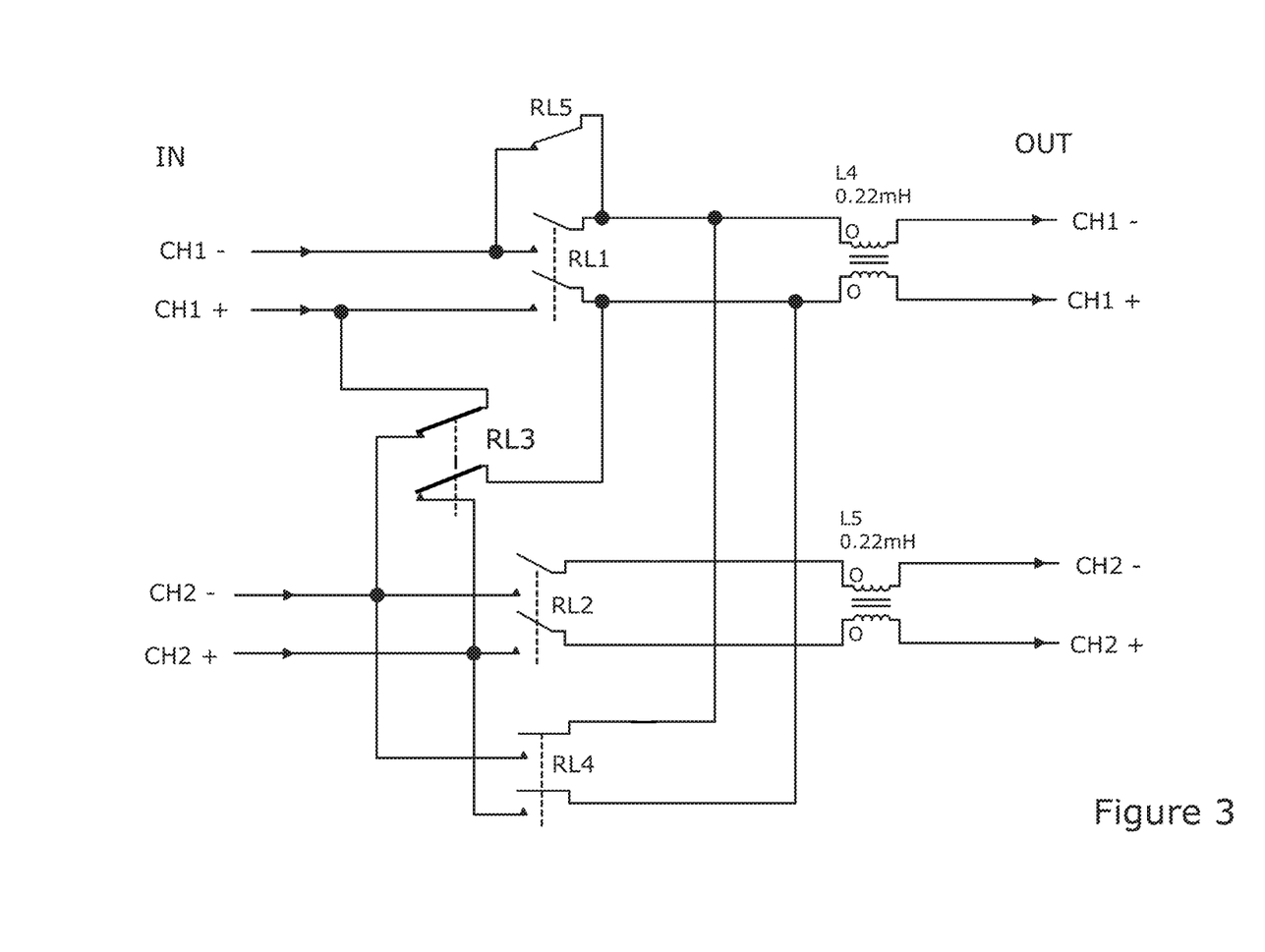
FIG. 3 shows series configuration.
Figure 4:
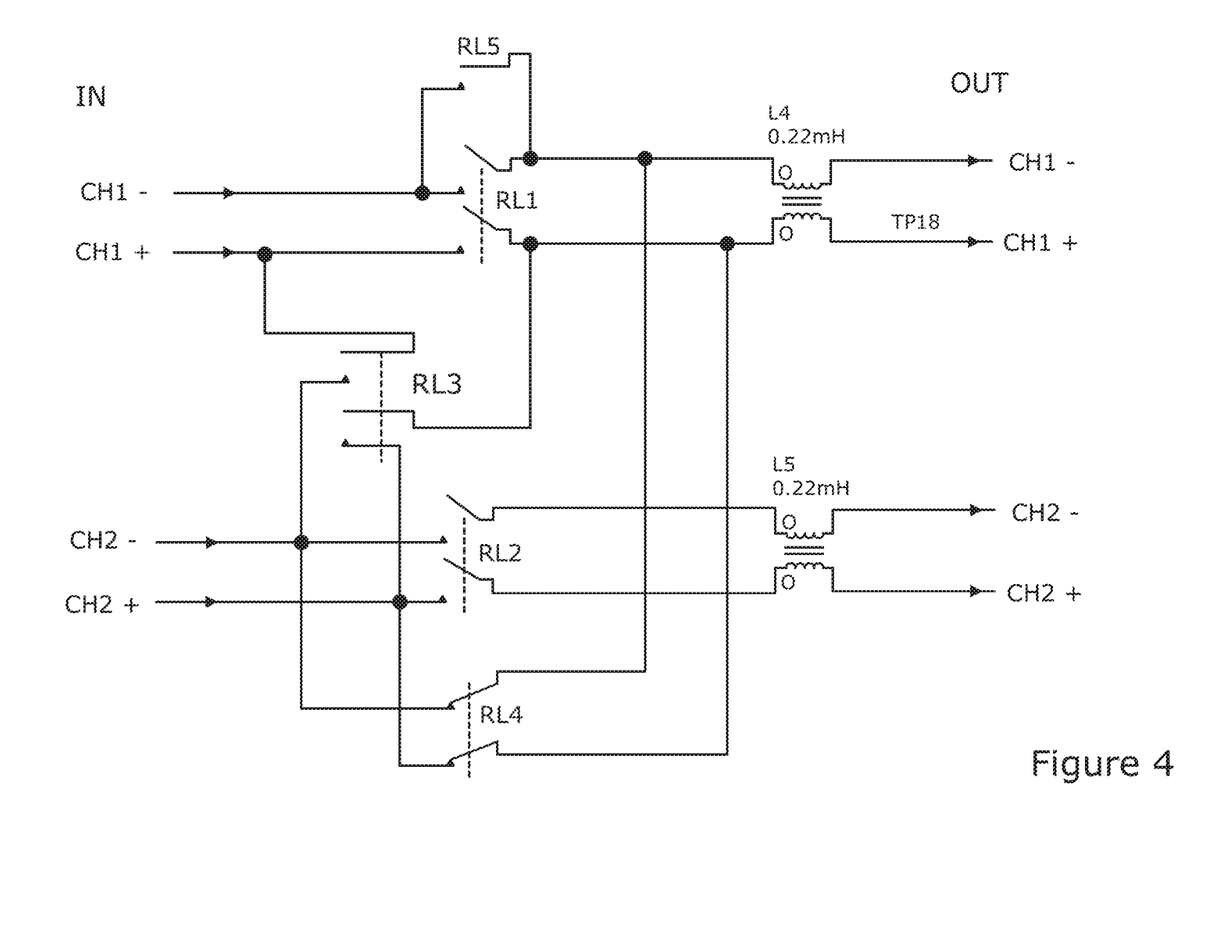
FIG. 4 shows amplifier 1 failure and isolation.
Figure 4A:
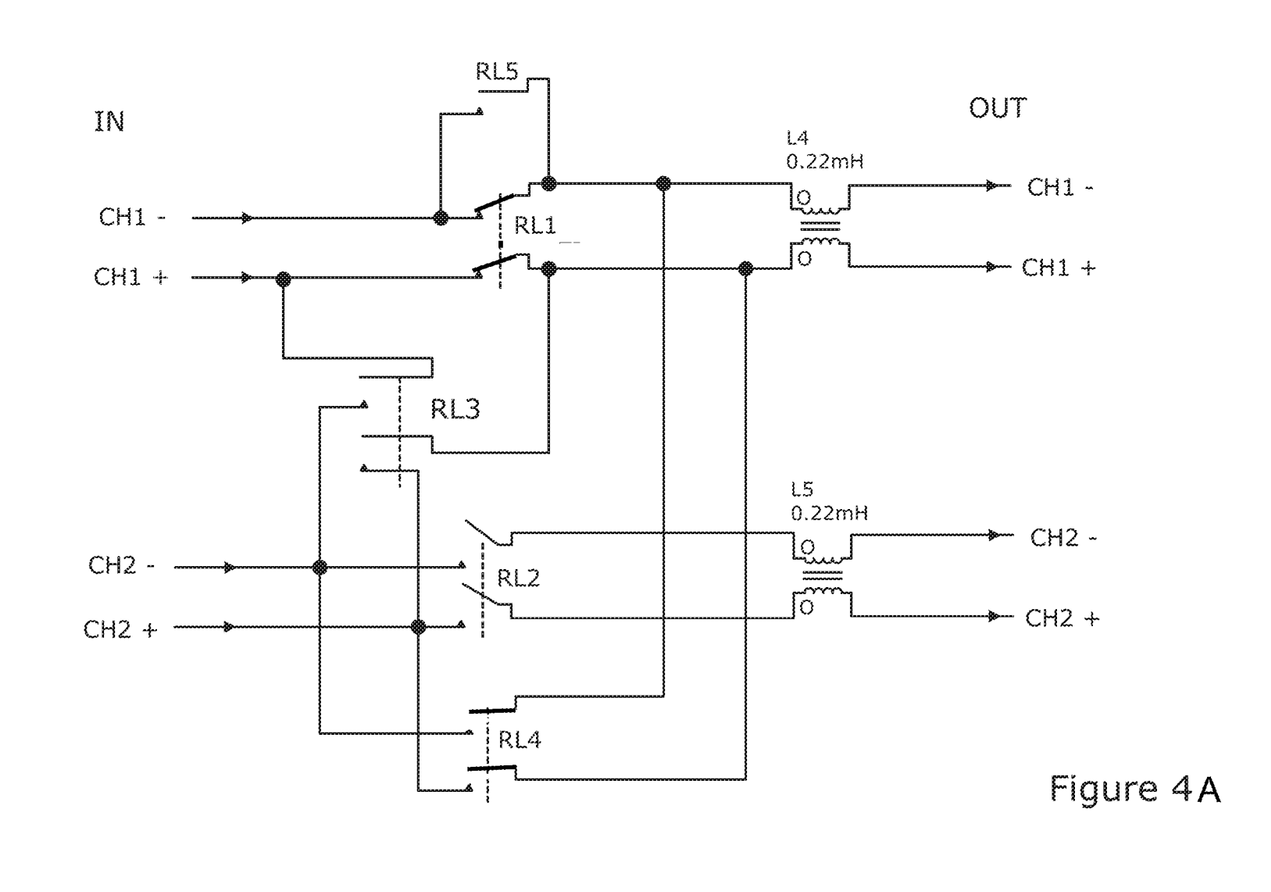
Figure 5:
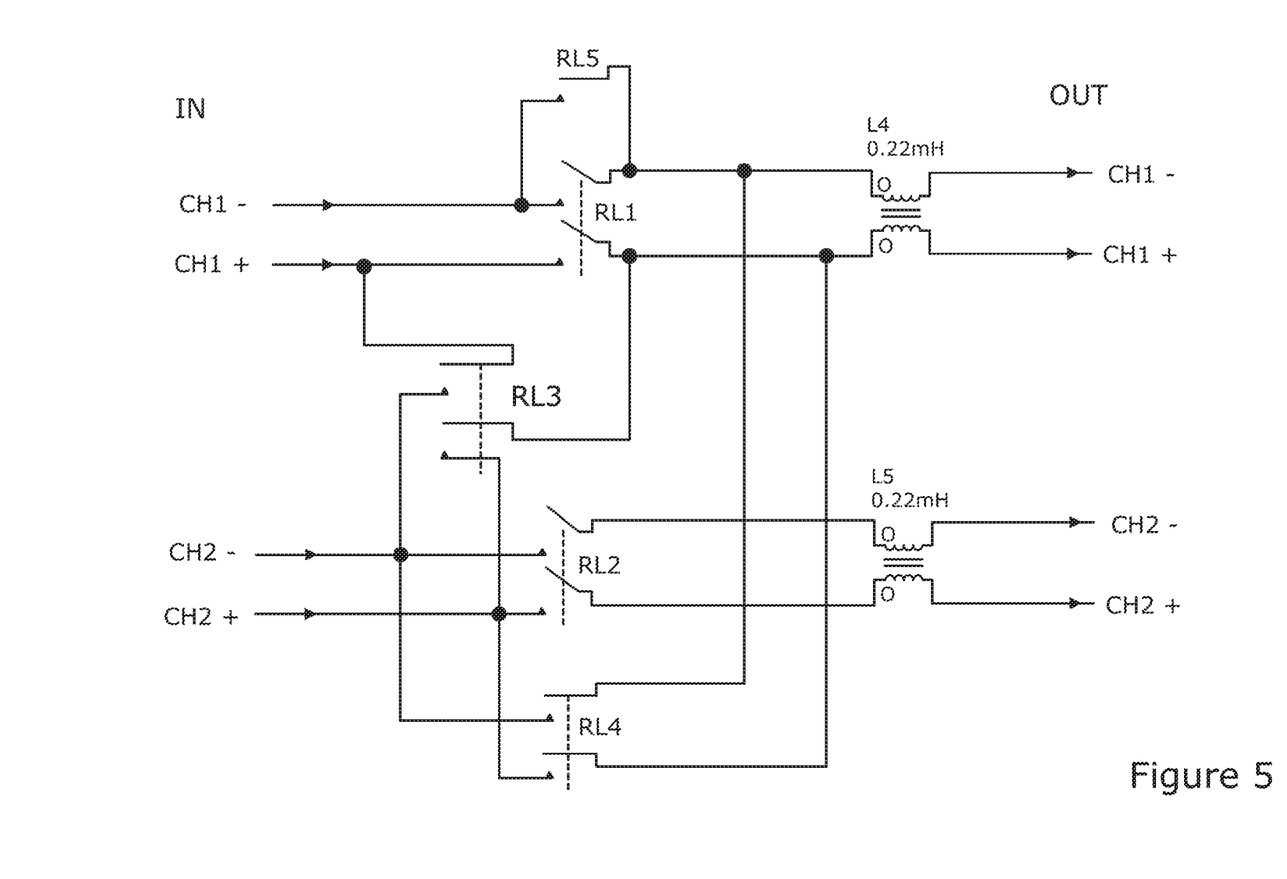
FIG. 5 shows amplifiers 1 and 2 isolated.

The present invention will now be illustrated by means of the following diagrams:

FIGS. 1 to 5 show a preferred combination of relays for use as part of the output stage of the present invention or as part of the audio system of the present invention. Each figure shows a different operating state of the relays;

FIG. 1 shows the relay configuration of the present invention in normal operation, the 1st mode;

FIG. 2 shows the relay configuration of the present invention in normal operation, the 1st mode; same as FIG. 1;

FIG. 3 shows series configuration;

FIG. 4 shows amplifier 1 failure and isolation;

FIG. 5 shows amplifiers 1 and 2 isolated;

FIG. 6 shows schematically the series amplifier configuration of the present invention in normal operation, the 1st mode;

FIG. 7 shows schematically the first form of the first failure mode;

FIG. 8 shows schematically the audio system of the present invention with the relays, for illustrative purposes, as FIG. 1; and FIG. 9 shows schematically an individual amplifier for use in the present invention.

Normal operation is when CH1 input is amplified by Amp1 at CH1 output, and CH2 input is amplified by Amp2 at CH2 output.

Mode 1—Normal operation is when CH1 input is amplified by Amp1 at CH1 output, and CH2 input is amplified by Amp2 at CH2 output.

Mode 2—CH1 input is selected for series amplifier operation to double the audio power on CH1 output. CH2 input is not used.

Modes 1 and 2 are configured by the user when the system is installed and configured as per their requirements.

Failure Mode—When Amp 1 and Amp 2 are in series, and Amp 1 fails this is isolated and Amp 2 output is routed to CH1 output.

Failure Mode 2—When Amp 1 and Amp 2 are in series, and Amp 2 fails this is isolated and Amp 1 output is routed to CH1 output.

The specific numerical values presented on components in the figures are illustrative of values of a preferred embodiment of the present invention but are not otherwise limiting.

FIG. 1 shows, all relays de-energised and provides a conventional configuration, (IN_CH1 connected to CH1_OUT and IN_CH2 connected to CH2_OUT). By example this would provide 250 W for each channel into 40 R@100 VRMS audio transducers. This is termed a fail active mode in which, should the supervisory processor in some way breakdown then both amplifiers are configured to output their respective inputs, should either 1 or both of these inputs the functional and their respective amplifier be functional then output will be achieved irrespective of MCU operation.

FIG. 2 shows, the series, 1st mode amplifier configuration of the present invention. By example this provides 500 W connected to CH1_OUT into 20 R@100 VRMS audio transducers. To operate in the first mode the following relay delayed switched sequence is required: Energise RL1, RL2, RL3, RL5. This action is preferably simultaneously carried out across the relays.

Each amplifier may be limited to a maximum voltage of 50 VRMS, but will need to source 5A RMS It should also be noted that L4 will need to handle 5A RMS when the Amps are in series sourcing a total power of 500 W into 20 R from CH1_OUTPUT.

FIG. 3 shows a first form of a first failure mode. Specifically, If IN_CH1 develops a fault when the amplifiers are configured as shown in FIG. 2, i.e. in series, the failure mode is achieved by optional shutdown of the failed amplifier (300) followed by then de-energise RL3, RL5 and energise RL4, and increase the maximum output voltage of the remaining amplifier (400) to 70.7 VRMS in order to provide 250 W into 20 R to maintain audio intelligibility. Increasing the maximum output voltage is preferably achieved by the MCU adjusting the gain of the remaining amplifier (400).

FIG. 4 shows second form of the first failure mode. Specifically, If IN_CH2 develops a fault when the amplifiers are configured as shown in FIG. 2, i.e. in series, the failure mode is achieved by optional shutdown of the failed amplifier (400) followed by de-energise RL3, RL5, RL1, and increase the maximum output voltage of Amp1 to 70.7 VRMS in order to provide 250 W into 20 R to maintain audio intelligibility. Increasing the maximum output voltage is preferably achieved by the MCU adjusting the gain of the remaining amplifier (400).

FIG. 5 shows an isolation, further, failure mode of the present invention shows. In order to isolate all audio transducer (for example speaker) lines from everything, energise RL1, RL2 our energised, and RL3, RL4, RL5 are de-energised. This failure mode enables the present invention to suspend operation, such as in a situation where the outputs the audio transducers are, for example both shorted and so maintain operability for a future situation.

Start-Up

In the present invention the amplifiers preferably comprise an inhibit input so that they only become operational when the power supply is with specification to avoid unstable operation, such as of the oscillator providing the pulses for switching. The inhibit may preferably be a mutually generated signal from each amplifier such that only when both signals are active are the amplifiers configured to output. By example the relay status shown in FIG. 5 may be maintained during this period.

In the present invention back-biased diode may be used across the output of each power module with dual outputs. This is illustrated in FIG. 6.

In the present invention the term first class D amplifier, or first-class D amplifier, means the first numbered class D amplifier and implies no allusion as to first class.

The invention claimed is:

1. An output stage for an audio system comprising two class-D audio amplifiers, the output stage providing amplification using one or more of the class-D audio amplifiers, the amplification being of an incoming audio signal to produce an output of an audio power signal for driving one or more sets of audio transducers to provide an audible output, the output stage further comprising:
   a. in a first mode the two class-D audio amplifiers are in series
   b. in a failure mode one of the two class-D audio amplifiers is an isolated, fault associated, class-D audio amplifier;
wherein the output stage is configured to transition from the first mode to the failure mode comprising:
   detecting a fault associated with one of the two class-D audio amplifiers; and
   isolating the one class-D audio amplifier associated with the fault and channeling input and output signals to and from the class-D audio amplifier not associated with the fault; and
   wherein clock signals for the two class-D audio amplifiers are independent.

2. The output stage of claim 1 wherein on entering the failure mode a gain of the first class-D amplifier is configured to be increased.

3. The output stage of claim 1 where in on entering the failure mode the outputs of the class-D amplifier associated with a fault is configured to be disconnected from the outputs of the first-class D amplifier.

4. The output stage of claim 1 wherein the two class-D audio amplifiers are of the same specification.

5. The output stage of claim 1 in which detecting the fault comprises detecting an out of specification value fault in one of the amplifiers selected from one or more of:
   a pulse width modulation protection level;
   an audio output over current;
   an amplifier temperature;

an amplifier humidity;
an amplifier dew point;
an amplifier supply over current;
an amplifier audio output overvoltage;
an amplifier power supply unit rail error and
an equipment shutdown input.

6. The output stage of claim 5 in which detecting the fault comprises detecting an out of specification value fault in one of the amplifiers of amplifier dew point.

7. The audio system of claim 6 wherein each amplifier has a separate power supply.

8. An audio system, the audio system comprising:
an input analogue switch array for receiving audio signals via an audio line input;
the audio line input being fed to a plurality of gain controlled preamplifiers;
wherein outputs of the plurality of gain controlled preamplifiers are routed to an output stage, having first and second audio amplifiers;
outputs of the first and second audio amplifiers are routed to an output switch array for supplying audio transducers;
the system being switchable between at least a first mode and a failure mode of the output stage via a microprocessor control unit configured to control the output stage; and
wherein clock signals for the two class-D audio amplifiers are independent.

9. The audio system of claim 8 wherein a preamplifier of the plurality of gain controlled preamplifiers associated with each of the two class-D audio amplifiers and a preamplifier switch array to switch the preamplifiers to the amplifiers such that only active class-D audio amplifiers are supplied with a preamplifier signal in operation.

10. The audio system of claim 9 in which the microprocessor control unit is configured to control all of the preamplifiers, switch array, amplifiers, and output switch array.

11. The audio system of claim 8 wherein each of the two class-D audio amplifiers has a separate power supply.

12. The audio system of claim 11 in which the microprocessor control unit is configured to control all of the preamplifiers, switch array, amplifiers, amplifier power supplies and output switch array.

13. The audio system of claim 8 in which the microprocessor control unit is configured to control all of the preamplifiers, switch array, amplifiers, and output switch array.

14. The audio system of claim 8 in which detecting the fault comprises detecting an out of specification value fault in one of the amplifiers selected from one or more of:
a pulse width modulation protection level;
an audio output over current;
an amplifier temperature;
an amplifier humidity;
an amplifier dew point;
an amplifier supply over current;
an amplifier audio output overvoltage;
an amplifier power supply unit rail error and
an equipment shutdown input.

15. A method of operating an output stage, the method comprising:
providing an audio system comprising two class-D audio amplifiers, the output stage providing amplification using one or more of the class-D audio amplifiers, the amplification being of an incoming audio signal to produce an output of an audio power signal for driving one or more sets of audio transducers to provide an audible output;
configuring, in a first mode, the two class-D audio amplifiers in series and upon receipt of a failure notification indicating a failure associated with one of the two class-D audio amplifiers and isolating the class-D audio amplifier associated with the failure and
configuring the output stage to channel input and output signals to and from the class-D audio amplifier not associated with the failure; and
wherein clock signals for the two class-D audio amplifiers are independent.

16. The method of claim 15 further comprising the step that on entering the failure mode the gain of the first class-D amplifier is increased.

17. The method of claim 16 further comprising the step on entering the failure mode that the outputs of the class-D amplifier associated with a fault are disconnected from the outputs of the first-class D amplifier.

18. The method of claim 15 further comprising the step on entering the failure mode that the outputs of the class-D amplifier associated with a fault are disconnected from the outputs of the first-class D amplifier.

* * * * *